(12) United States Patent
Liu et al.

(10) Patent No.: US 9,801,277 B1
(45) Date of Patent: Oct. 24, 2017

(54) BELLOWS INTERCONNECT

(71) Applicant: Flextronics AP, LLC, Broomfield, CO (US)

(72) Inventors: Weifeng Liu, Dublin, CA (US); Zhen Feng, San Jose, CA (US); Anwar Mohammed, San Jose, CA (US); David Geiger, Dublin, CA (US); Murad Kurwa, San Jose, CA (US)

(73) Assignee: Flextronics AP, LLC, Broomfield, CO (US)

( * ) Notice: Subject to any disclaimer, the term of this patent is extended or adjusted under 35 U.S.C. 154(b) by 0 days.

(21) Appl. No.: 14/455,772

(22) Filed: Aug. 8, 2014

Related U.S. Application Data

(60) Provisional application No. 61/870,582, filed on Aug. 27, 2013.

(51) Int. Cl.
| | |
|---|---|
| *H05K 1/14* | (2006.01) |
| *H05K 3/24* | (2006.01) |
| *H05K 1/02* | (2006.01) |
| *H01R 12/52* | (2011.01) |
| *H05K 3/30* | (2006.01) |
| *H05K 3/00* | (2006.01) |

(52) U.S. Cl.
CPC .............. *H05K 1/14* (2013.01); *H01R 12/52* (2013.01); *H05K 1/0271* (2013.01); *H05K 3/0085* (2013.01); *H05K 3/241* (2013.01); *H05K 3/303* (2013.01); *H05K 2201/04* (2013.01); *H05K 2201/068* (2013.01); *H05K 2201/10734* (2013.01); *H05K 2201/2045* (2013.01); *H05K 2203/0338* (2013.01); *H05K 2203/0723* (2013.01)

(58) Field of Classification Search
CPC .......... H05K 1/14; H05K 1/141; H05K 1/144; H05K 1/148; H05K 3/241; H01R 12/772
See application file for complete search history.

(56) References Cited

U.S. PATENT DOCUMENTS

| | | | | |
|---|---|---|---|---|
| 3,951,493 | A * | 4/1976 | Kozel | H01R 12/714 439/591 |
| 5,184,827 | A | 2/1993 | Suttle | |
| 5,259,833 | A | 11/1993 | Barnett | |
| 5,764,498 | A * | 6/1998 | Sundstrom | F16F 15/04 248/570 |
| 5,940,268 | A * | 8/1999 | Miyahara | H01L 23/467 165/121 |
| 6,160,254 | A | 12/2000 | Zimmerman | |
| 6,271,585 | B1 * | 8/2001 | Osada | C22C 1/0475 257/712 |
| 7,019,973 | B2 * | 3/2006 | Rivera | 361/700 |
| 7,191,803 | B2 | 3/2007 | Orr | |
| 7,573,727 | B2 | 8/2009 | Hauenstein | |

(Continued)

Primary Examiner — Jeremy C Norris
(74) Attorney, Agent, or Firm — Haverstock & Owens LLP

(57) ABSTRACT

A compliant interconnect with a cylindrical bellows structure is configured to reduce a stress between a substrate and a PCB board. The stress can be caused by a CTE (coefficient of thermal expansion) mismatch, a physical movement, or a combination thereof. The compliant interconnect can be solder to and/or immobilized on one or more coupling structure. Alternatively, the compliant interconnect can include an instant swapping structure (such as a socket) that makes the upgrade of the electronic components easier.

20 Claims, 4 Drawing Sheets

(56) References Cited

U.S. PATENT DOCUMENTS

| | | |
|---|---|---|
| 8,258,011 B2 | 9/2012 | Brun |
| 8,469,741 B2 | 6/2013 | Oster |
| 8,861,220 B2 | 10/2014 | Loher |
| 2002/0094701 A1 | 7/2002 | Biegelsen |
| 2003/0127246 A1 | 7/2003 | Watanabe |
| 2004/0229533 A1 | 11/2004 | Braekevelt |
| 2005/0280157 A1 | 12/2005 | Roush |
| 2007/0054511 A1 | 3/2007 | Ittel |
| 2007/0125295 A1 | 6/2007 | Sanguinetti |
| 2007/0290305 A1 | 12/2007 | Oyama |
| 2008/0060873 A1 | 3/2008 | Lang |
| 2009/0317639 A1 | 12/2009 | Axisa |
| 2010/0090834 A1 | 4/2010 | Buchnick |
| 2012/0050036 A1 | 3/2012 | Landry |
| 2012/0314382 A1 | 12/2012 | Wesselmann |
| 2014/0299362 A1 | 10/2014 | Park |
| 2014/0362020 A1 | 12/2014 | Rothkopf |
| 2015/0009129 A1 | 1/2015 | Song |
| 2015/0091711 A1 | 4/2015 | Kosonen |
| 2015/0185944 A1 | 7/2015 | Magi |
| 2015/0312653 A1 | 10/2015 | Avrahami |
| 2016/0187122 A1 | 6/2016 | Krimon |

* cited by examiner

BELLOWS INTERCONNECT

CROSS-REFERENCE TO RELATED APPLICATION(S)

This application claims priority under 35 U.S.C. §119(e) of the U.S. Provisional Patent Application Ser. No. 61/870,582, filed Aug. 27, 2013 and titled, "3D PRINTING WITH COMPONENTS EMBEDDED," which is also hereby incorporated by reference in its entirety for all purposes.

FIELD OF THE INVENTION

The present invention relates to electronic component assembly. More specifically, the present invention relates to connections for electronic components.

BACKGROUND OF THE INVENTION

Typical solder joints have some shortcomings including solder joint fatigue, pad cratering, and head in pillow defects. The solder joint fatigue can be caused by the CTE (Coefficient of thermal expansion) mismatch between components and PCB (Printed Circuit Board). Pad cratering can be caused by shocks and vibrations during transportation, especially for large components assembly. Head in pillow defects can happen during a reflow process due to warpage of packages at a reflow temperature.

To mitigate the above problems, various solutions are typically used. For example to mitigate the solder joint fatigue problem, lower performance organic substrate or HiCTE substrate are used to match the CTE between the substrate and PCB. Organic substrates provide inferior electrical performance as compared to ceramic substrate. To reduce pad cratering, cushions to the system packaging are added to reduce the shock impact during transportation, which results in increased costs. X-rays have been used to screen the assembly to examine the occurrences of head-in-pillow (HiP); however, it is very challenging for x-ray to screen out all the HiP defects.

SUMMARY OF THE INVENTION

A bellow structure is used as a compliant interconnect. The compliant interconnect is formed between components and PCB, which offsets the stresses during the transportation and field use, such that the probability of component failures are able to be reduced.

In an aspect, an interconnect comprises a stress relieving member between a substrate and a PCB board. In some embodiments, the stress relieving member comprises a substantially cylindrical structure. In other embodiments, the stress relieving member comprises a bellow structure. In some other embodiments, the stress relieving member comprises a cylindrical bellow structure. In some embodiments, the stress relieving member is configured to reduce a stress. In other embodiments, the stress comprises a CTE (coefficient of thermal expansion) mismatch between the substrate and the PCB board. In some other embodiments, the stress comprises a strain that is caused by a physical movement. In some embodiments, the physical movement comprises shocking, vibration, translational movement, or a combination thereof.

In another aspect, a method of forming an interconnect comprises placing a stress relieving member between a substrate and a PCB board. In some embodiments, the stress relieving member comprises a bellow structure. In other embodiments, the bellow structure comprises a cylindrical structure. In some other embodiments, the method further comprises forming the bellow structure on a cylindrical object. In some embodiments, the cylindrical object comprises a water soluble polymer. In other embodiments, the cylindrical object comprises a metal. In some other embodiments, the metal comprises aluminum, nickel, or a combination thereof. In some embodiments, the method further comprises electroplating a layer of metal on the bellow structure. In other embodiments, the method further comprises dissolving the cylindrical object. In some other embodiments, the method further comprises soldering the stress relieving member to the substrate. In some embodiments, the method further comprises compressing the interconnect by a clamping force.

In another aspect, a method of forming an interconnect for electronic components comprises forming a mandrel with a cylindrical bellow structure using a cylindrical object, electroplating a layer of metal on the mandrel, dissolving the mandrel, such that a connecting member with a cylindrical bellow structure is formed, and soldering the connecting member to a substrate of the electronic components.

Other features and advantages of the present invention will become apparent after reviewing the detailed description of the embodiments set forth below.

BRIEF DESCRIPTION OF THE DRAWINGS

Embodiments will now be described by way of examples, with reference to the accompanying drawings which are meant to be exemplary and not limiting. For all figures mentioned herein, like numbered elements refer to like elements throughout.

DETAILED DESCRIPTION OF THE PREFERRED EMBODIMENT

Reference is made in detail to the embodiments of the present invention, examples of which are illustrated in the accompanying drawings. While the invention is described in conjunction with the embodiments below, it is understood that they are not intended to limit the invention to these embodiments and examples. On the contrary, the invention is intended to cover alternatives, modifications and equivalents, which can be included within the spirit and scope of the invention as defined by the appended claims. Furthermore, in the following detailed description of the present invention, numerous specific details are set forth in order to more fully illustrate the present invention. However, it is apparent to one of ordinary skill in the prior art having the benefit of this disclosure that the present invention can be practiced without these specific details. In other instances, well-known methods and procedures, components and processes have not been described in detail so as not to unnecessarily obscure aspects of the present invention. It is, of course, appreciated that in the development of any such actual implementation, numerous implementation-specific decisions must be made in order to achieve the developer's specific goals, such as compliance with application and business related constraints, and that these specific goals are vary from one implementation to another and from one developer to another. Moreover, it is appreciated that such a development effort can be complex and time-consuming, but is nevertheless a routine undertaking of engineering for those of ordinary skill in the art having the benefit of this disclosure.

Figure 1:
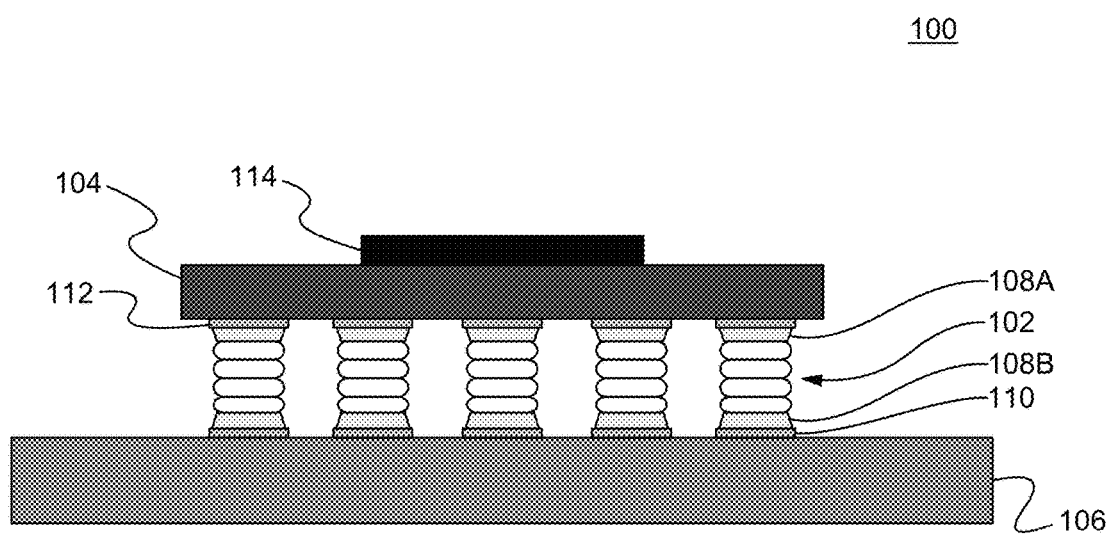
FIG. 1 illustrates an interconnect in accordance with some embodiments of the present invention.

FIG. 1 illustrates an interconnect 100 in accordance with some embodiments of the present invention. The interconnect 100 can be a compliant interconnect 102. The compliant interconnect 102 can be a hollow bellow. In some embodiments, the compliant interconnect 102 is coupled/attached to the substrate 104, such as a BGA (Ball Grid Array) substrate, via upper solder joint 108A on a BGA pad 112 to the top end of the compliant interconnect 102. The bottom end of the compliant interconnect 102 can be coupled/attached to the PCB 106 via the solder joint 108B on a PCB pad 110.

The compliant interconnect 102 provides a buffer to offset the stress caused by the CTE mismatch, therefore can minimize or mitigate the stresses on the solder joints. In some embodiments, the compliant interconnect 102 is used as socket contact to mate to the PCB 106 allowing the feasibility to upgrade the BGA packages, because of its separable contacts. The compliant bellow provides multiple contact points and therefore are more reliable than those single point contact beam spring contructions. In some embodiments, the interconnect 102 can be separated from the substrate 104 at the BGA pad 112. In other embodiments, the interconnect 102 can be separated from the PCB 106 at the PCB pad 110.

In some embodiments, the compliant interconnect 102 can be fabricated through stand alone process, such as electroforming. Next, finishes (e.g., tin, solder, OSP (Organic Solderability Preservative), nickle/gold, silver) are plated. The bellows are then solder to the BGA substrate pads. During SMT (Surface-mount technology) process, the BGA package with bellow can be directly soldered to the PCB 106.

The compliant interconnect disclosed herein provides advantageous features. The compliant interconnect offsets the stress caused by the CTE mismatch between the low CTE ceramic substrate (e.g., substrate 104 has a CTE around 6~8) and high CTE PCB (e.g., PCB 106 has a CTE around 17), which can increase the solder joint life. Further, the compliant interconnect 102 adds cushions and buffers the strains on the solder joint and PCB during product transportation. In the transportation or use of products, shocks and vibrations are generally unavoidable. The compliant interconnect 102 minimizes/reduces the occurrence of pad catering. Furthermore, the compliant interconnect 102 provides the upgradability of the components. The compliant interconnect 102, such as the bellows construction, can be used as reliable socket contact, which allows demating of the BGA packages, such that the system can be upgraded. Moreover, the compliant interconnect 102 eliminates the head-in-pillow defects, which occurs frequently in the process of product assembly. In some embodiments, the compliant interconnect 102 offsets the effects of package warpage at reflow temperature. Additionally, in other embodiments, the compliant interconnect 102 meets the reliability requirements of assembly of high I/O ceramic packages (such as, CCGA (Ceramic Column Grid Array), Cu column, and beam contact socket).

Figure 2:
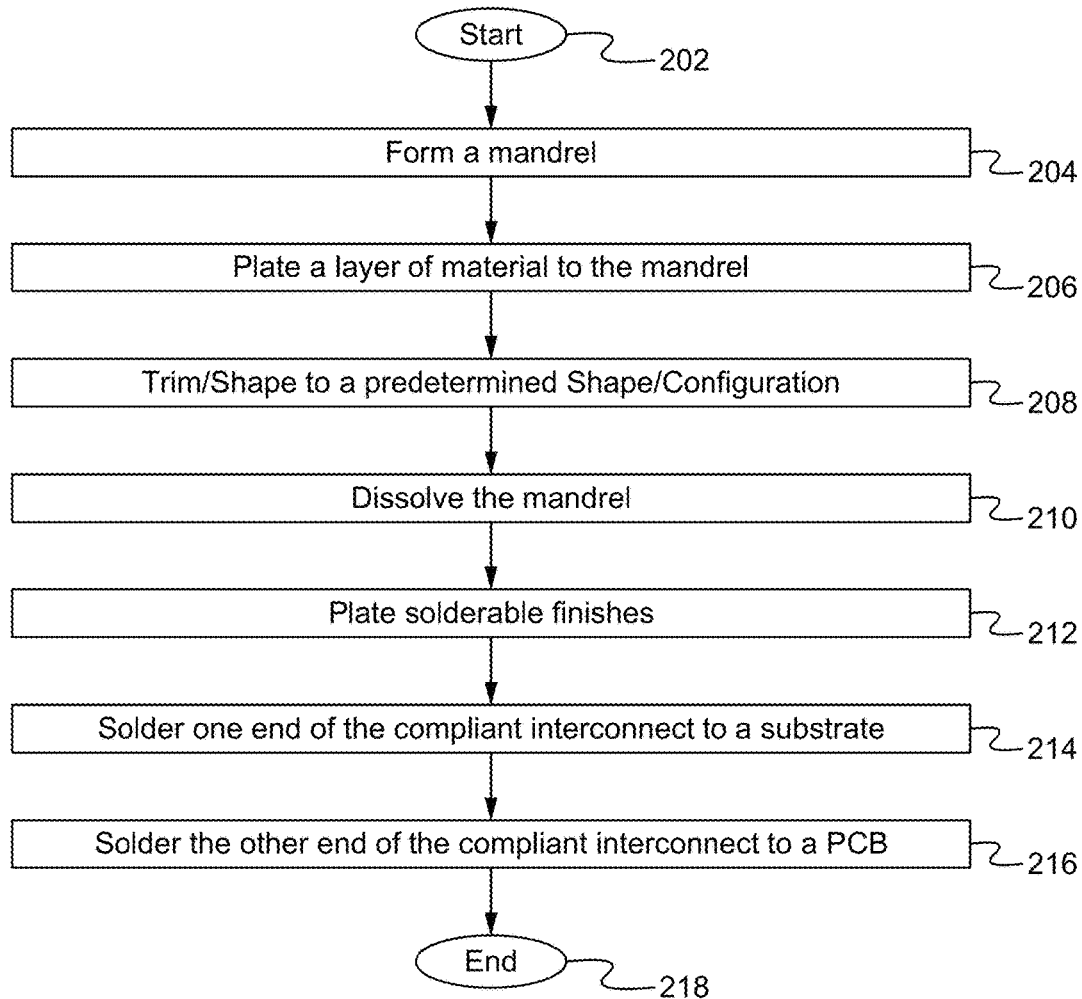
FIG. 2 illustrates a compliant interconnect manufacturing method in accordance with some embodiments of the present invention.

FIG. 2 illustrates a compliant interconnect manufacturing method 200 in accordance with some embodiments of the present invention. The method 200 can start at Step 202. At Step 204, a mandrel is formed/shaped. At Step 206, a layer of material is plated onto the mandrel. At Step 208, the mandrel is shaped/trimmed to a predetermined shape/configuration. At Step 210, the mandrel is dissolved. At Step 212, solderable finishes are plated to form a compliant interconnect. At Step 214, one end of the compliant interconnect is soldered to a substrate. At Step 216, the other end of the compliant interconnect is soldered to a PCB. The method can stop at Step 218.

Figure 3:
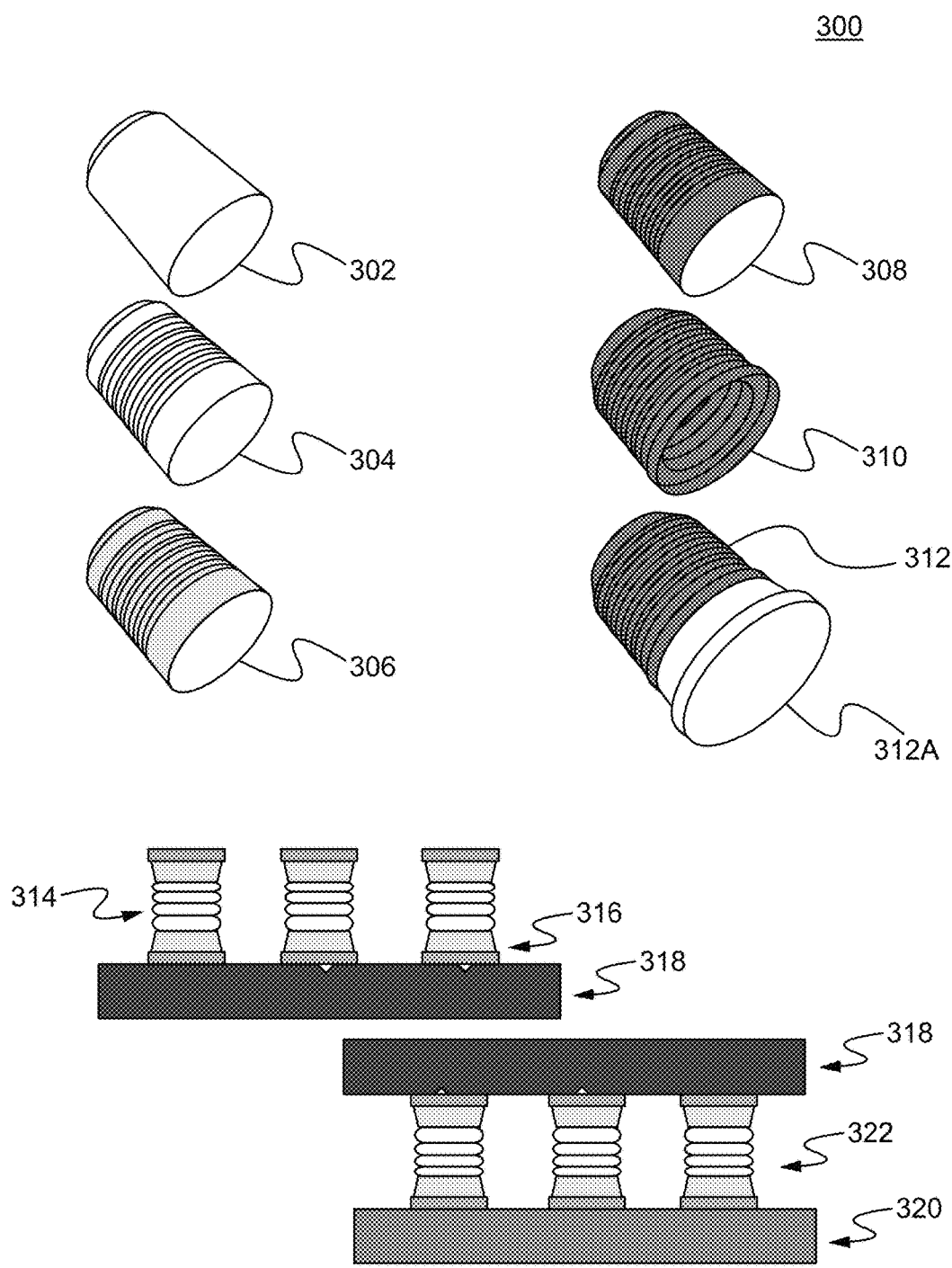
FIG. 3 illustrates a process of forming a compliant interconnect in accordance with some embodiments of the present invention.

FIG. 3 illustrates a process 300 of forming a compliant interconnect in accordance with some embodiments of the present invention. The method can start from selecting a cylindrical object 302 with a predetermined length. The cylindrical object can be water soluble polymer, and aluminum, nickel. A person of ordinary skill in the art appreciates that any other materials can be used as the cylindrical object so long as it can be shaped/crafted to form the compliant interconnect in any predetermined shape, such as a square pillar. For example, a material that has a predetermined flexibility, compressibility, deformability, and extensibility that can provide the compliant properties, such as shock absorbing and durable, is able to be used as the material for forming the compliant interconnect. The length of the cylindrical object can be sufficiently long, such that a single cylindrical object can be used to make a complete piece of the compliant interconnect. In some embodiments, a single unit/piece of the compliant interconnect can be joined by two pieces of the cylindrical object, such as by a glue or by solder.

The cylindrical object 302 can be machined to form an internal geometry of a bellows 304. Electroplating processes are used to plate/deposit a thin layer of metal (such as, copper, nickle, silver, or alloy) on the mandrel with a controlled and predetermined thickness, such as 1/100 of the diameter of the cylindrical object 302, forming a plated mandrel 306. In the case if a polymeric mandrel is used, the polymer can be treated with a precursor and an electroless plating and/or an electrolytic process are used to plate a metal.

The metal deformation of the plated mandrel 306 is trimmed to form the final shape or configuration of the compliant interconnect, such as a bellows compliant interconnect 308. Next, the mandrel of the bellows compliant interconnect 308 is dissolved in a solution. In some embodiments, the solution comprises a caustic solution for dissolving aluminum. In other embodiments, the solution comprises water for dissolving water soluble mandrel. In some other embodiments, the solution comprises organic liquid, such as DMSO, DMF, hexane, and acetone, for dissolving polymers.

A shell of the bellows 310 is formed after the mandrel is dissolved. The bellows 310 is further plated with solderable finishes (such as OSP (Organic surface protection/Organic Solderability Preservative), tin, and lead free solder) forming solderable bellows 312. A solid base 312A of the bellows 312 is soldered to a BGA substrate pad 316 forming a soldered bellows 314 on a substrate 318. The soldering can be performed using a soldering process. In some embodiments, a fixture is used to hold on the bellows in place during the soldering process. Next, the other side of the bellows 312 is soldered onto a PCB 320 forming a compliant bellows interconnect 322. In some embodiments, the soldering volume is controlled to prevent shorting between top and bottom.

Figure 4:
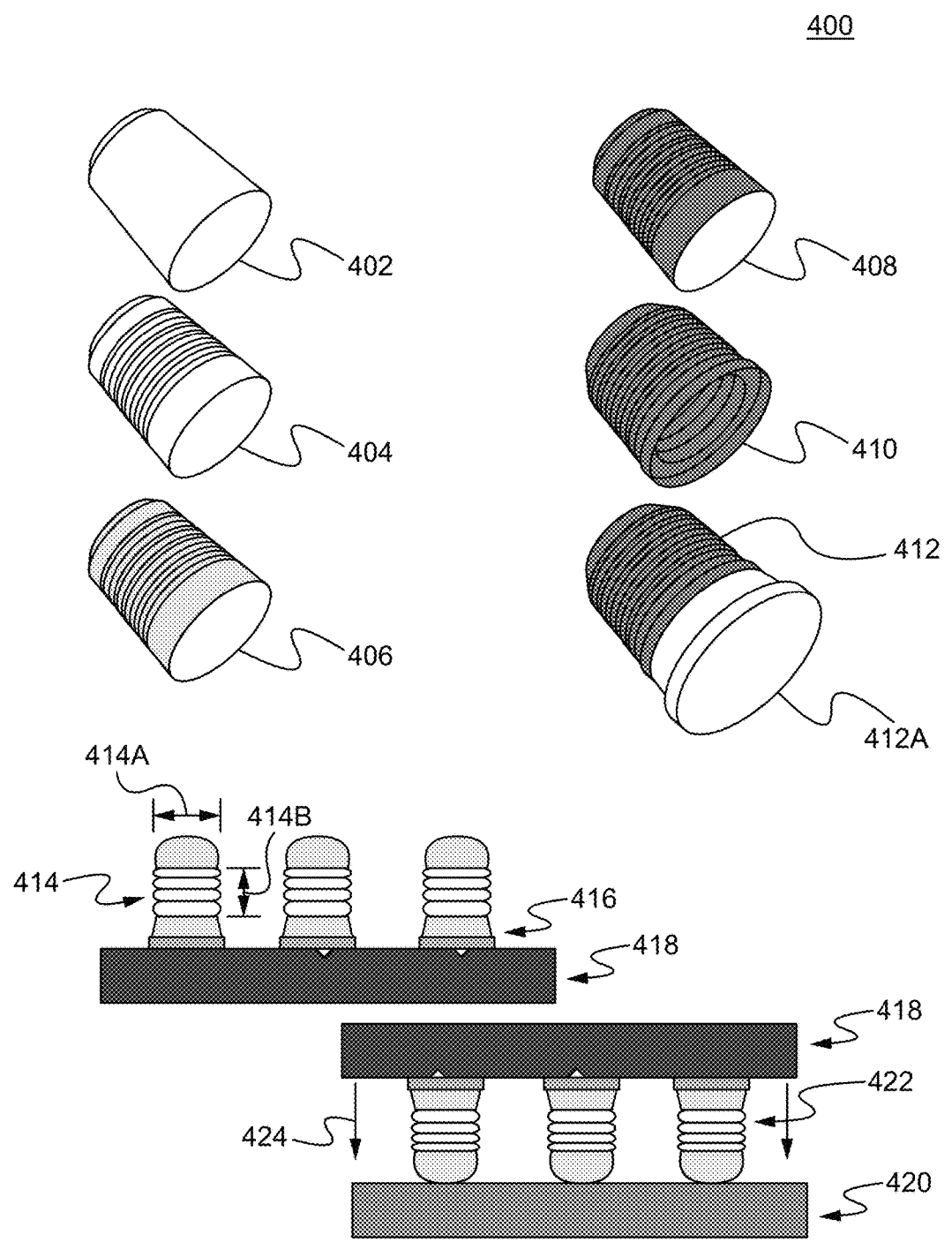
FIG. 4 illustrates a process of forming another compliant interconnect in accordance with some embodiments of the present invention.

FIG. 4 illustrates a process 400 of forming a compliant interconnect in accordance with some embodiments of the present invention. The method can start from selecting a cylindrical object 402 with a predetermined length. The cylindrical object can be water soluble polymer, aluminum, and nickel. A person of ordinary skill in the art appreciates that any other materials can be used as the cylindrical object so long as it can be shaped/crafted to form the compliant interconnect.

The cylindrical object 402 can be machined to form an internal geometry of a bellows 404. Electroplating processes are used to plate/deposit a thin layer of metal (such as, copper, nickle, silver, or alloy) on the mandrel with a controlled and predetermined thickness, forming a plated mandrel 406. In the case if a polymeric mandrel is used, the polymer can be treated with a precursor and an electroless and/or an electrolytic process are used to plate a metal.

The metal deformation of the plated mandrel 406 is trimmed to form the final shape or configuration of the compliant interconnect, such as a bellows compliant interconnect 408. Next, the mandrel of the bellows compliant interconnect 408 is dissolved in a solution. The solution can be used similar to the solution disclosed in the method 300 of FIG. 3.

A shell of the bellows 410 is formed after the mandrel is dissolved. The bellows 410 is further plated with contact finishes (such as Ni/Au, Ni/Pd/Au, and silver) forming contacting bellows 412. A solid base 412A of the bellows 412 is soldered to a BGA substrate pad 416 forming a soldered bellows 414 on a substrate 418. The soldering can be performed using a soldering process. In some embodiments, a fixture is used to hold on the bellows in place during the soldering process. Next, the package with bellows connection is compressed to the PCB pads through a clamping force 424, such that the bellows are compressed at certain percentage to form a contact interface with the PCB pads 420. The bellows connection is compressed to the PCB pads 420 and not soldered, such that the bellows connection can be removed from the PCB pads 420 anytime enabling quick replacement and instant detachment. In some embodiments, the diameter 414A of the bellows can be 0.5-0.75 mm and the length 414B of the bellows can be 1-2 mm.

The interconnect disclosed herein can comprises two types. One type of the interconnect is soldered to PCB/substrate, once soldered, the components are immobilized and/or removable. The other type of the interconnect, such as a socket structure, is physically coupled with the PCB/substrate through a mechanical coupling (such as compression), which can be replaced and/or removed easily.

To utilize the interconnect, the interconnect can be used in the high reliability applications, such as mainframe computer, high end server, and infrastructure telecom equipment. The interconnect can also be used/attached to high performance high I/O ceramic BGA packages, such as aluminum substrate and high CTE ceramic substrate. The ceramic substrates provides superior electrical performance that are used in high performance computing with I/O 2000 and or above, such as 5000 I/Os.

In operation, the compliant interconnect can be operated to offset the stresses between the ceramic substrate and the PCB, such that potential defects caused by the stresses can be avoided/reduced.

The present invention has been described in terms of specific embodiments incorporating details to facilitate the understanding of principles of construction and operation of the invention. Such reference herein to specific embodiments and details thereof is not intended to limit the scope of the claims appended hereto. It is readily apparent to one skilled in the art that other various modifications can be made in the embodiment chosen for illustration without departing from the spirit and scope of the invention as defined by the claims.

What is claimed is:

1. An interconnect comprising a stress relieving member configured to interface between an electronic component hosting substrate and a PCB board, wherein the stress relieving member includes a bellows structure and a layer of metal on the bellows structure.

2. The interconnect of claim 1, wherein the stress relieving member comprises a substantially cylindrical structure.

3. The interconnect of claim 1, wherein the stress relieving member comprises a cylindrical bellows structure.

4. The interconnect of claim 1, wherein the stress relieving member is configured to reduce a stress.

5. The interconnect of claim 4, wherein the stress comprises a CTE (coefficient of thermal expansion) mismatch between the substrate and the PCB board.

6. The interconnect of claim 4, wherein the stress comprises a strain that is caused by a physical movement.

7. The interconnect of claim 6, wherein the physical movement comprises shocking, vibration, translational movement, or a combination thereof.

8. A method of forming an interconnect comprising placing a stress relieving member between an electronic component hosting substrate and a PCB board, wherein the stress relieving member includes a bellows structure and a layer of metal on the bellows structure.

9. The method of claim 8, wherein the bellows structure comprises a cylindrical structure.

10. The method of claim 8, further comprising forming the bellows structure on a cylindrical object.

11. The method of claim 10, wherein the cylindrical object comprises a water soluble polymer.

12. The method of claim 10, wherein the cylindrical object comprises a metal.

13. The method of claim 12, wherein the metal comprises aluminum, nickel, or a combination thereof.

14. The method of claim 10, further comprising dissolving the cylindrical object.

15. The method of claim 8, further comprising soldering the stress relieving member to the substrate.

16. The method of claim 8, further comprising compressing the interconnect by a clamping force.

17. A method of forming an interconnect for electronic components comprising:
   a. forming a mandrel with a cylindrical bellows structure using a cylindrical object;
   b. electroplating a layer of metal on the mandrel;
   c. dissolving the mandrel, such that a connecting member with a cylindrical bellows structure is formed; and
   d. soldering the connecting member to substrate of the electronic components.

18. The method of claim 17, wherein the cylindrical object comprises a water soluble polymer.

19. The method of claim 17, wherein the cylindrical object comprises a metal.

20. The method of claim 17, wherein the metal comprises aluminum, nickel, or a combination thereof.

* * * * *